United States Patent [19]

McMann et al.

[11] Patent Number: 4,954,423
[45] Date of Patent: Sep. 4, 1990

[54] PLANAR METAL INTERCONNECTION FOR A VLSI DEVICE

[75] Inventors: Ronald E. McMann; Evaristo Garcia, Jr., both of Rosenberg; Michael T. Welch, Sugar Land; Stephen W. Thompson, Richmond, all of Tex.

[73] Assignee: Texas Instruments Incorporated, Dallas, Tex.

[21] Appl. No.: 323,108

[22] Filed: Mar. 13, 1989

Related U.S. Application Data

[63] Continuation of Ser. No. 11,355, Jan. 19, 1987, abandoned, which is a continuation of Ser. No. 762,885, Aug. 6, 1985, abandoned.

[51] Int. Cl.$^5$ .................................................. G03C 5/00
[52] U.S. Cl. .................................... 430/316; 430/317; 430/318; 437/190; 437/192; 156/652; 156/643
[58] Field of Search ............... 430/313, 314, 316, 317, 430/318; 437/190, 192; 204/192 EL; 156/643, 652, 664, 659.1, 646

[56] References Cited

U.S. PATENT DOCUMENTS

| | | | |
|---|---|---|---|
| 4,394,211 | 7/1983 | Uchiyama et al. | 156/628 |
| 4,410,622 | 10/1983 | Dalal et al. | 430/312 |
| 4,536,951 | 8/1985 | Rhodes et al. | 437/190 |
| 4,541,169 | 9/1985 | Bartush | 29/591 |
| 4,605,470 | 8/1986 | Gwozdz et al. | 156/643 |
| 4,614,021 | 9/1986 | Hulseweh | 29/590 |
| 4,621,045 | 11/1986 | Gardner | 430/311 |
| 4,670,091 | 6/1987 | Thomas et al. | 156/643 |

FOREIGN PATENT DOCUMENTS

58-98931  6/1983  Japan ................................. 430/323

OTHER PUBLICATIONS

Kitcher, "Integral Stud for Multilevel Metal", IBM TDB, vol. 23, No. 4, Sep. 1980, p. 1395.

Primary Examiner—Jose G. Dees
Attorney, Agent, or Firm—B. Peter Barndt; James T. Comfort; Melvin Sharp

[57] ABSTRACT

A method of interconnecting metal layers in integrated circuits separated by an intermediate dielectric layer by forming first and pillar layers of metal, etching the pillar layer to form a pillar of electrically conducting material and etching the first level to form the first level lead. A layer of dielectric is applied to cover the pillar and first level lead. A layer of photoresist is deposited over the dielectric with a spin on technique to form a planar surface. The dielectric and photoresist are etched back with an equal etch rate until a top portion of the pillar is exposed. A second level lead is formed atop the pillar and planar top surface of the dielectric.

27 Claims, 1 Drawing Sheet

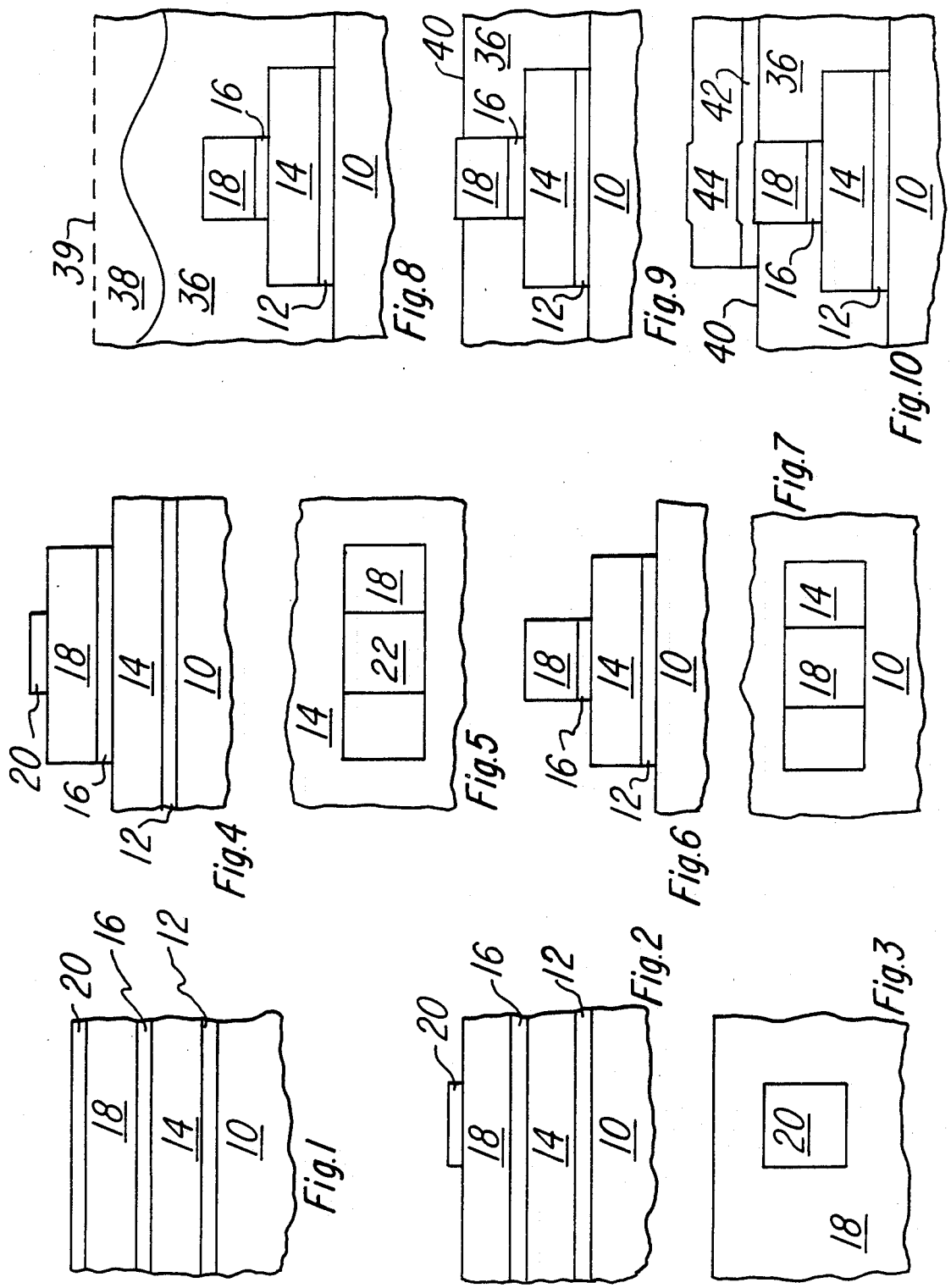

PLANAR METAL INTERCONNECTION FOR A VLSI DEVICE

This application is a continuation of application Ser. No. 011,355, filed 01/19/87 now abandoned which is a continuation of application Ser. No. 06/762,885, filed Aug. 6, 1985 abandoned.

OTHER APPLICATIONS

The present application discloses subject matter to which copending application Ser. No. 676,123, filed on Nov. 29, 1984 by Fuller and Morris, abandoned and Ser. No. 846,849, filed Apr. 1, 1986 also abandoned are pertinent, all applications having been assigned to Texas Instruments.

BACKGROUND OF THE INVENTION

The present invention relates to a method of forming planar interconnections between metal layers separated by a dielectric layer in a VLSI device.

The standard technique for interconnecting metal layers through an intermediate dielectric known as the "via process" has been to simply etch a hole defined by a layer of photoresist placed over the dielectric. The etch process used has been either the older wet etch process or a dry etch one. In the wet etch process sloped, isotropically etched side walls result while dry etching creates near-vertical oxide steps due to its anistropic etching behaviour. Generally following dry etching and before metal deposition the intermediate dielectric is heated until it reflows to slope the hole sidewall. This sloping helps to minimize thinning of a metal layer deposited over the walls of the hole. The latter metal deposition provides ohmic contact with the underlying metal layer through the etched hole.

While the via process has proven successful for VLSI and early VLSI technology the shrinking gap between contacts required in advanced VLSI technology has revealed major problems with the via process. The standard via process requires leads which are flared around the top of the via. This flaring requirement restricts the metal pitch and requires about 20 to 30% more bar area.

A step coverage problem arises in via interconnections because of the reduced thickness of conductor laid down over the sidewall of the passageway when making the plug or interconnect conducting layer which can cause excessive circuit resistance of the interconnect.

Due to the lack of planarity of the upper metal layer in the region of the interconnect resulting from the via process a via interconnection can not be laid down over another via interconnection or over a contact.

A design limitation occurs when placing via formed interconnects adjacent to one another on adjacent leads. With extremely tight metal pitches, the slopes of the adjacent interconnects tend to run together and cause metal shorts.

Numerous other potential problems occur due to lack of planarity in via formed interconnects when dealing with multilevel metal systems.

It is therefore an object of this invention to provide an improved method of interconnection between metal layers suitable for high density integrated circuits.

It is a further object to provide a method of interconnection which permits planarity of the upper metal layer in the region of the interconnection.

It is another object of this invention to provide a method of interconnecting metal layers which substantially increases the sidewall pitch of the interconnection and therefore permits closer spacing of adjacent interconnections.

SUMMARY OF THE INVENTION

In accordance with the invention there is provided a method of interconnecting different metal layers through an intermediate dielectric layer. The method includes forming first and pillary layers of electrically conducting material on the face of a semiconductor. Barrier layers are formed over the pillar layer and the first level lead layer which are patterned and used as masks to define the underlying conductor metal patterns.

BRIEF DESCRIPTION OF THE DRAWINGS

The invention will be better understood by reference to the detailed description which follows, read in conjunction with the accompanying drawings, wherein:

FIG. 1 is an elevation view in section of a semiconductor device with a series of alternating metal alloy layers of titanium tungsten alloy and aluminum copper alloy deposited thereon;

FIG. 2 is an elevation view of the device of FIG. 1 with the top layer etched to the dimensions of the pillar interconnections;

FIG. 3 is a plan view of the device shown in FIG. 2;

FIG. 4 is an elevation view in section of the device shown in FIGS. 2 and 3 with the first lead defined and etched into the top layer of aluminum copper and underlying titanium-tungsten;

FIG. 5 is a plan view of the device shown in FIG. 4;

FIG. 6 is an elevation view in section of the device with the first level lead, the pillar interconnection defined and the top pillar pad of titanium-tungsten removed;

FIG. 7 is a plan view of the device shown in FIG. 6;

FIG. 8 is an elevation view in section of the device of FIGS. 6 and 7 with layers of plasma oxide and photoresist deposited thereon;

FIG. 9 is an elevation view in section of the device of FIG. 8 with the photoresist and plasma oxide etched back to expose the pillar interconnection; and FIG. 10 is the device of FIG. 9 with a second level lead deposited onto the pillar interconnection.

DETAILED DESCRIPTION WITH REFERENCE TO THE DRAWINGS

Referring to FIG. 1 successive alternating layers of titanium-tungsten 12, 16, and 20 and aluminum-copper 14 and 18 alloys are deposited onto a semiconductor face 10 by a sputter system having multi target capabilities. The thickness of each titanium tungsten (Ti-W) layer is about 2300 Å while that for each aluminum-copper layer is about 5,000 Å.

A pillar interconnection area is defined using positive photoresist and the direct step on wafer (DSW) align and expose technique. The top layer of TiW is selectively etched in a Reactive Ion Etch System using dry Fluorine chemistry to form a pillar pad 22 in Ti-W layer 20 as shown in FIGS. 2 and 3. Undercutting of the TiW during the etching process is minimal so that the final dimensions of the pillar interconnection can be made to be less than the current limits of about 3 microns×3 microns. After etch the photoresist pad is removed in a wet resist strip which also acts as a protection against Al-Cu corrosion.

Referring to FIGS. 4 and 5, the dimensions of a first level lead is defined using a positive photoresist and the DSW align and expose technique. The lead is necessarily positioned so that the pillar interconnection pad 22 is within the confines of the former. Etching is performed in a Reactive Ion Etch System (R.I.E.) using dry chlorine chemistry into the pillar layer which includes Al-Cu deposit 18 and Ti-W barrier deposit 16. The photoresist is then stripped to expose Al-Cu deposit 18 except where the pillar pad 22 is located. The stripping of the photoresist is done in situ in the R.I.E. system to guard against corrosion of exposed Al-Cu.

Once the photoresist is stripped, the R.I.E. system is set up to etch Al-Cu deposits 18 and 14 using the aforesaid chlorine chemistry. The etch uses pillar pad 22 as a mask to etch the pillar interconnection in Al-Cu deposit 18 and the Ti-W barrier layer 16 to etch the Al-Cu deposit 14 to the dimensions of the first level lead. The etchant selected for removing the AlCu deposits 14 and 18 should remove the latter at least 4 times the rate it removes the Ti-W barrier deposits 22 and 16.

A subsequent Ti-W etch removes pad 22, and Ti-W in deposit 12 from the areas around the base of the lower level lead defined by layers 12 and 14 and from level 16 at the base of the pillar interconnection. The device as seen in FIGS. 6 and 7 then receives an anti-corrosion step in situ before being removed for inspection.

As shown in FIG. 8 a layer of dielectric composed of plasma enhanced CVD oxide 36 to a thickness of about 23 kilo Angstroms is deposited over the first level lead and pillar interconnection. Photoresist 38 is deposited over the plasma oxide 36 with a spin on technique to fill the valleys created by the first level lead and the pillar interconnection and create a planar surface 39 over the whole device.

The planar surface 39 is then etched back in a Reactive Ion Etch System using CHF3 and O2 or other Fluorine chemistries. The etch of the plasma oxide and the ash of photoresist must be near a 1:1 ratio in order to end up with a planar dielectric layer. This can easily be adjusted with flow rates, pressures and power levels. The etch back is stopped, leaving about 1000 A of the top of the pillar interconnection exposed as shown in FIG. 9.

Finally, as shown in FIG. 10, a second level lead 42,44 is deposited on planar surface 40 over pillar 18,16.

The final thickness of the interlevel dielectric is controlled by the height of the pillar and if a thicker dielectric is desired, the process is easily controlled at metal deposition, by increasing the Al-Cu thickness.

The pillar interconnection is not limited to the alloys of Al-Cu and Ti-W but will work on other two metal systems having differing etch rates.

The process can be repeated for additional levels as desired. Each metal layer is planar and the pillar interconnects between each layer should be ohmic, and not add resistance to the circuit.

The pillar interconnection is defined and etched as the metal lead is being defined and etched giving it an inherent alignment to the lead. Unlike the via process the pillar interconnection allows the leads to lay flat on top of the pillar giving no reduction in metal thickness. A pillar between a 2nd and 3rd level of metal can be located directly over a pillar between a 1st and 2nd level of metal giving a designer the ability to stack many levels of metal to reduce bar area.

Other variations, departures and modifications lying within the spirit of the invention and scope as defined by the appended claims will be obvious to those skilled in the art.

What is claimed:

1. A method of forming a contact or interconnect for a semiconductor integrated circuit device, comprising:
   forming first and pillar layers of electrically conducting material on a face of the semiconductor
   forming a pillar masking pad on said pillar layer;
   photolithographically patterning and etching the pillar and first layers to the dimension of a first lead confining said pillar masking pad; and
   etching the pillar layer to form a pillar.

2. A method according to claim 1, including:
   respectively forming first and second mask layers over said pillar and first layers, said mask layers substantially thinner than said pillar and first layers;
   photolithographically patterning and etching the mask layer over the pillar to the dimensions of the pillar;
   photolithographically patterning and etching the pillar layer and mask layer over the first layer to the dimensions of the first lead; and
   etching concurrently the pillar and first lead to form a pillar of conducting material located within boundaries of the first lead.

3. A method according to claim 2, wherein etching steps include a reactive ion etch.

4. A method according to claim 2, including a depositing a dielectric material of a thickness sufficient to cover the pillar and first lead, depositing a photoresist layer with a smooth top surface over the dielectric, and photolithographically patterning and etching back the photoresist and dielectric with an etchant that etches both the photoresist and dielectric at substantially the same rate so as to expose the upper surface of the pillar.

5. A method according to claim 4, wherein said photoresist applying step includes a spin on operation to flatten the photoresist.

6. A method according to claim 2, wherein said pillar and first masking layers are a refractory metal.

7. A method according to claim 6, wherein said refractory metal is titanium-tungsten alloy.

8. A method according to claim 1, including etching said pillar layer to form the pillar and the first layer to form the first lead concurrently.

9. A method according to claim 8, wherein said said etching step is reactive ion etching.

10. A method according to claim 1, further comprising forming a mask layer over said first and pillar layers.

11. A method according to claim 10, wherein said mask layers are barrier metal.

12. A method according to claim 11, wherein said barrier metal is titanium-tungsten.

13. A method for forming a contact or interconnect for an integrated circuit device comprising:
   forming a conductive first lead layer and a conductive pillar layer on a face of a substrate;
   forming a pillar masking pad on said pillar layer;
   photolithographically patterning the pillar layer to first lead dimensions confining the pillar masking pad;
   etching the pillar layer and the first lead layer to respectively define a pillar and a first lead.

14. The method of claim 13, wherein the step of forming a pillar masking pad comprises:
   forming a pillar masking layer on the pillar layer;

photolithographically patterning the pillar masking layer to form a pillar masking pad pattern;

etching said pillar masking layer to form a pillar masking pad.

15. The method of claim 13, wherein the pillar layer and the first lead layer are concurrently etched.

16. The method of claim 13, wherein the pillar layer and the first lead layer comprise a refractory metal.

17. The method of claim 13, wherein further comprising forming one barrier layer beneath the first lead layer and another barrier layer beneath the pillar layer.

18. The method of claim 17, wherein the barrier layers comprise tungsten-titanium and the first lead and pillar layers comprise aluminum alloy.

19. A method of interconnecting different metal layers through an intermediate insulating layer, comprising the steps of:

forming first and pillar layers on the face of a semiconductor each with a bottom deposit of barrier metal and a top deposit of conducting metal and an upper layer of barrier metal atop said pillar layer;

photolithographically masking and etching said upper layer of barrier metal to form a pillar masking pad;

photolithographically masking and etching said pillar layer and barrier metal under the pillar layer to dimensions of a first lead;

etching exposed portions of the pillar layer and first lead layer to form a pillar and first lead;

depositing a layer of dielectric sufficiently thick to cover said pillar interconnection and said first level lead;

applying a layer of photoresist so as to form a planar surface over said pillar and said first level lead;

etching back the photoresist and dielectric so as to expose a top portion of said pillar; and depositing another layer of conducting material over said pillar and dielectric material to form a second level lead.

20. A method according to claim 19, including depositing a layer of barrier metal below said first lead layer and after etching exposed portions of said pillar and first lead layer etching off exposed portions of said barrier metal atop the pillar and atop and below the first level lead.

21. A method according to claim 19, wherein the dielectric is plasma enhanced CVD oxide and the etching steps are by dry anisotropic etching.

22. A method according to claim 19 wherein the barrier metal is tungsten-titanium alloy and the conducting metal is aluminum copper alloy.

23. A method of forming a conductive interconnect on a face of a semiconductor body, comprising the steps of:

applying a bottom barrier layer to said face, applying a first conductive layer to said face, applying a first barrier layer to said face over said first conductive layer, applying a second conductive layer to said face over said first barrier layer, then applying a second barrier layer to said face over said second conductive layer;

photolithographically masking and selectively removing said second barrier layer to leave a pillar mask on said face, then selectively removing said second conductive layer and said first barrier layer to leave a first conductive strip extending over said face to define a first lead area;

etching said face using said second and first barrier layers as masks and said second and bottom barrier layers as etch stops to thereby remove said second conductive layer except under said strip area, leaving a pillar and a first lead;

applying an insulating coating to said face to cover the pillar and the conductive strip and to cover other areas of said face not covered by the conductive strip to produce an uneven surface with raised areas above the pillar and conductive strip;

applying to said face a coating of a filler material which flows to create a plane surface above raised areas and other areas of said face;

etching said face with an etchant which removes said filler material at about the same rate as it removes said insulator coating until the filler material has been removed and the top of the pillar has been exposed, leaving a substantially plane top surface;

then applying another conductive strip to said face contacting said pillar.

24. A method according to claim 23, wherein said first and second barrier layers are refractory metal functioning as an etch stop.

25. A method according to claim 23, wherein said first and second conductive layers are highly conductive metal, and said insulator coating is silicon oxide.

26. A method according to claim 24, wherein said filler material is photoresist.

27. A method according to claim 25, wherein said steps of selectively removing the second and first conductive layers use etchant which removes the conductive layers at a rate of at least about four times the rate it removes the barrier layers.

* * * * *